(12) United States Patent
Abhishek et al.

(10) Patent No.: US 11,146,057 B2
(45) Date of Patent: Oct. 12, 2021

(54) PAD PROTECTION IN AN INTEGRATED CIRCUIT

(71) Applicant: NXP USA, INC., Austin, TX (US)

(72) Inventors: Kumar Abhishek, Bee Cave, TX (US); Srikanth Jagannathan, Austin, TX (US)

(73) Assignee: NXP USA, Inc., Austin, TX (US)

( * ) Notice: Subject to any disclaimer, the term of this patent is extended or adjusted under 35 U.S.C. 154(b) by 406 days.

(21) Appl. No.: 16/170,162

(22) Filed: Oct. 25, 2018

(65) Prior Publication Data

US 2020/0136373 A1    Apr. 30, 2020

(51) Int. Cl.
*H02H 7/20*    (2006.01)

(52) U.S. Cl.
CPC .................................. *H02H 7/205* (2013.01)

(58) Field of Classification Search
CPC ........................ H02H 7/205; H03K 19/018592
USPC .............................................. 361/90, 86, 91.1
See application file for complete search history.

(56) References Cited

U.S. PATENT DOCUMENTS

| | | | |
|---|---|---|---|
| 4,428,020 A * | 1/1984 | Blanchard, Jr. .. | G01R 19/16538 327/545 |
| 4,945,445 A | 7/1990 | Schmerda et al. | |
| 5,414,380 A | 5/1995 | Floyd et al. | |
| 5,436,786 A * | 7/1995 | Pelly ...................... | H02H 9/041 361/111 |
| 5,448,441 A * | 9/1995 | Raposa ............ | H03K 17/08122 361/18 |
| 7,003,421 B1 * | 2/2006 | Allen, III ......... | G01R 19/16552 702/117 |
| 7,136,269 B2 | 11/2006 | Iimura et al. | |
| 7,269,764 B2 * | 9/2007 | Dart ....................... | G11C 5/147 340/660 |
| 7,295,412 B2 * | 11/2007 | Sasaki ................... | B60W 10/08 361/91.1 |
| 7,679,380 B2 | 3/2010 | Tai | |
| 10,153,768 B1 * | 12/2018 | Micielli .............. | H01L 27/0266 |
| 10,359,452 B2 * | 7/2019 | Hernandez Creus ........ G01R 19/16538 | |
| 2004/0070430 A1 | 4/2004 | La Rosa | |
| 2008/0239599 A1 * | 10/2008 | Yizraeli ................. | H02H 9/046 361/56 |
| 2009/0002046 A1 | 1/2009 | Song | |
| 2009/0268355 A1 * | 10/2009 | Wang ..................... | H02H 3/325 361/18 |

* cited by examiner

*Primary Examiner* — Dharti H Patel

(57) ABSTRACT

An integrated circuit includes a signal pad, an output buffer having an output coupled to the signal pad and having an enable input, an input buffer having an input coupled to the signal pad and having an enable input, a counter, and a gating circuit. The counter is enabled to start counting down a predetermined count value when a voltage on the signal pad is both higher than a predetermined low threshold voltage and lower than a predetermined high threshold voltage, wherein the predetermined low threshold voltage corresponds to a threshold below which a voltage corresponds to a logic level zero and the predetermined high threshold voltage corresponds to a threshold above which a voltage corresponds to a logic level one. The gating circuit is configured to, in response to the counter expiring, disable the input buffer and the output buffer.

19 Claims, 4 Drawing Sheets

PAD PROTECTION IN AN INTEGRATED CIRCUIT

BACKGROUND

Field

This disclosure relates generally to integrated circuits, and more specifically, to pad protection in an integrated circuit.

Related Art

In an integrated circuit (IC), improper usage of a general-purpose input/output (GPIO) pad by a customer application can lead to various problems. For example, contention can occur in the GPIO pad when the pad is driven by the output buffer of the GPIO and by circuitry external to the IC at two different values. This can cause permanent damage of the GPIO due, for example, to electromigration or other failures arising from reliability mechanisms. Also, in another example, input pad terminals can be externally driven with signals having slow ramp rates, resulting in functional failures in the IC. This can be due, for example, to noise causing glitches at the input buffer. Therefore, a need exists for improved protection of GPIO pads or input pads within an IC.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a reliability detector may be used for a GPIO pad to detect and protect against problematic and damaging situations, such as contention, in which contention can be caused by driving different values on to the GPIO pad (or can be caused by floating inputs). Also, a reliability detector may be used for an input pad (such as a reset pad) to detect slow ramping input signals and prevent problematic glitches. Both types of reliability detectors use comparators and a programmable counter to determine when a voltage at the pad lingers too long at a voltage between CMOS thresholds (longer than required for a typical transition). In this manner, the programmable counter can provide an indication of this situation and gating circuitry can be used to disable the input or output buffers, or both, of a pad. For example, in the case of an input pad, the programmable counter can provide an indication of a slow ramp so as to temporarily disable the input buffer around the noisy switch point of the input buffer. In the case of a GPIO pad, the programmable counter can provide an indication of damaging contention at the pad, and disable the input and output buffers until the contention is cleared. At this point, the input and output buffers can be safely re-enabled by an explicit signal, such as from control circuitry within the IC.

Figure 1:
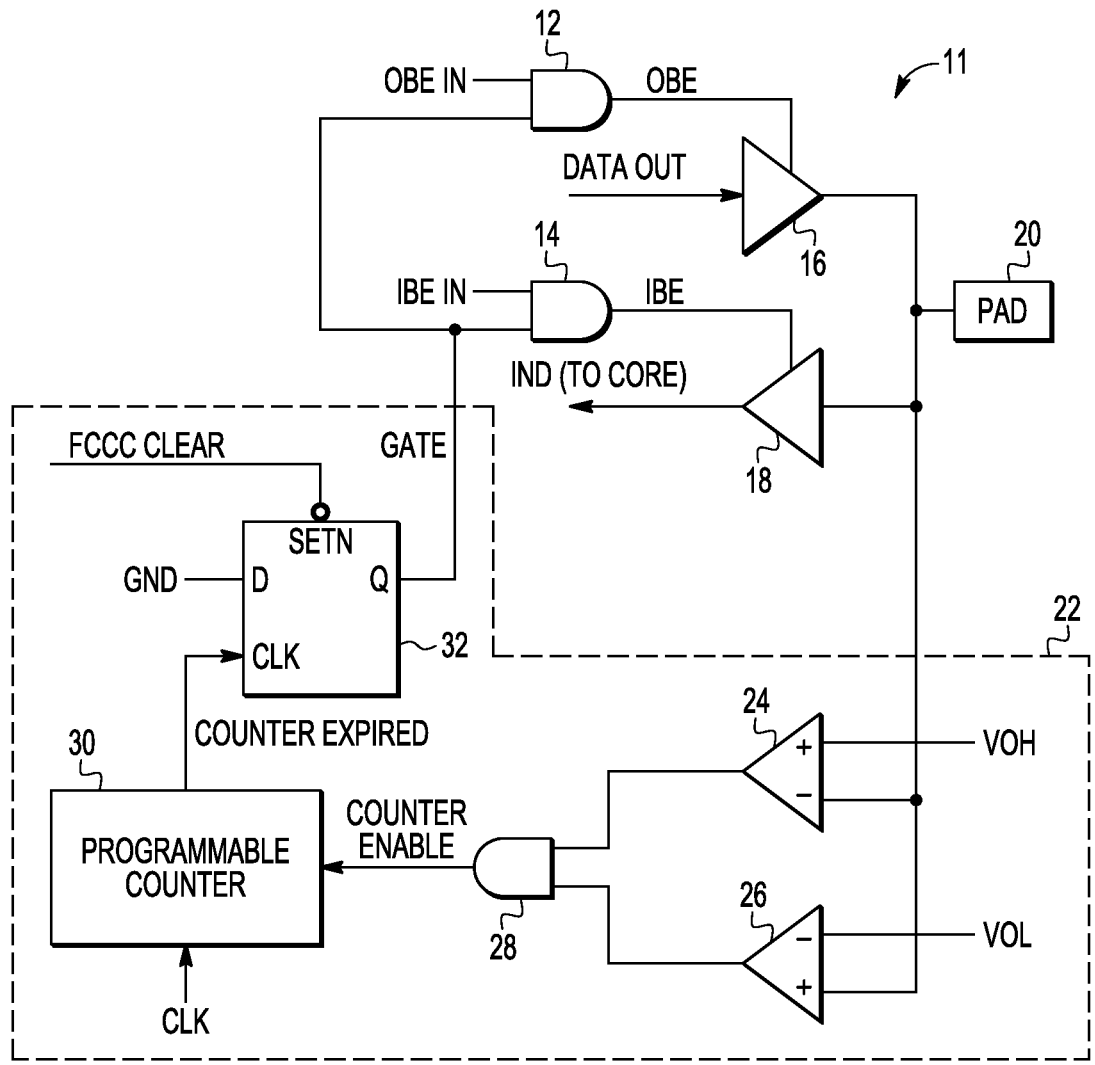
FIG. 1 illustrates, in partial block diagram form and partial schematic form, a GPIO circuit and a corresponding protection circuit, in accordance with one embodiment of the present invention.

FIG. 1 illustrates, in partial block diagram form and partial schematic form, an integrated circuit (IC) 10 having a GPIO circuit 11 and a corresponding protection circuit 22, in accordance with one embodiment of the present invention. GPIO circuit 11 includes an input/output (I/O) pad 20, output buffer 16, input buffer 18, and AND gates 12 and 14. A first input of AND gate 12 is coupled to receive an input output buffer enable signal, OBE_IN, a second input of AND gate 12 is coupled to receive a gate signal, GATE, from protection circuit 22, and an output of AND gate 12 provides an output buffer enable signal, OBE, to an enable input of buffer 16. Buffer 16 is coupled to receive DATA OUT as an input, and, when OBE is asserted, provides DATA OUT as an output to pad 20. When OBE is negated or deasserted, an output is not provided to pad 20. A first input of AND gate 14 is coupled to receive an input input buffer enable signal, IBE IN, a second input of AND gate 14 is coupled to receive GATE from protection circuit 22, and an output of AND gate 14 provides an input buffer enable signal, IBE, to an enable input of buffer 18. An input of buffer 18 is coupled to pad 20, and, when IBE is asserted, provides data from pad 20 as IND at its output. IND is provide to IC 10, such as to a processing core of IC 10.

Protection circuit 22, coupled to GPIO circuit 11, includes a D flip flop 32, a programmable counter 30, an AND gate 28, and comparators 24 and 26. A first input (non-inverting input) of comparator 24 is coupled to receive a first threshold voltage, VOH, and a second input (inverting input) of comparator 24 is coupled to pad 20. An output of comparator 24 is coupled to a first input of AND gate 28. A first input (inverting input) of comparator 26 is coupled to receive a second threshold voltage, VOL, and a second input (non-inverting input) is coupled to pad 20. An output of comparator 26 is coupled to a second input of AND gate 28. An output of AND gate 28 provides a counter enable signal to an enable input of programmable counter 30, which also receives a clock signal, clk. An output of programmable counter 30, which indicates if counter 30 has expired, is coupled to a clock input, CLK, of D flip flop 32. A data input, D, of flip flop 32 is coupled to ground, GND, and an inverse reset input, SETN, is coupled to receive a signal from a fault collection and control circuit (FCCC), such as FCCC CLEAR. A data output, Q, of flip flop 32 is coupled to provide GATE to GPIO circuit 11. Upon providing a logic level 0 to SETN, flip flop is reset such that a logic level one is provided at output Q. (Therefore, the SETN input may be referred to as a set input of the D flip flop.) When a rising edge is provided at input CLK, the value at D is clocked into flip flop 32 and provided as Q. Therefore, upon a rising edge to CLK, Q is cleared to a logic level zero since input D is coupled to ground.

In operation, each of OBE and IBE, provided to the enable inputs of buffers 16 and 18, respectively, are gated by the value of GATE. That is, when GATE is a logic level zero, OBE and IBE are logic level zeros, no matter the values of OBE IN or IBE IN. When GATE is a logic level one, though, the value of OBE IN is provided as OBE and the value of IBE IN is provided as IBE. Note that D flip flop 32 can be implemented with other types of latches which are capable of latching a gating value (such as GATE) to provide to GPIO circuit 11 and are capable of being reset so as to no longer gate IBE or OBE. The value of VOH and VOL correspond to Complementary Metal Oxide Semiconductor (CMOS) levels. VOH of a CMOS buffer or inverter corresponds to the smallest output voltage which is considered as a logic level one, and VOL corresponds to the highest output voltage which is considered as a logic level zero. When the input to a CMOS buffer switches from one logic state (e.g. a logic level zero) to another logic state (e.g. a logic level one), its output switches from a value lower than or equal to VOL to a value higher than or equal to VOH. The transition time between the two limits, VOL and VOH, is dependent on the slew rate of the input signal as well as the current drive of the PMOS and NMOS transistors, coupled in series, forming the buffer. A CMOS buffer output is typically higher than or equal to VOH or less than or equal to VOL when the input is held constant and it may be between VOH and VOL when the output is driven to a different logic state by another driver. Also, a typical or normal CMOS transition is fairly quick, dependent upon the capacitive load and is in the range of nanoseconds.

By using threshold values VOH and VOL, comparators 24 and 26 detect when a voltage on pad 20 is between a CMOS logic level high and low. This may indicate that pad 20 is transitioning between a high or a low or is stuck between CMOS logic levels without reaching either logic state. The latter case may be indicative of contention at pad 20. For example, contention may occur when pad 20 is being driven by a source external to IC 10 to a level different than the value being driven by buffer 16. Contention may also occur due to floating inputs on pad 20, such as due to a circuit board fault. Contention may result in permanent damage of GPIO circuit 11 due to electromigration issues or other reliability mechanisms. Therefore, protection circuit 22, in response to comparators 24 and 26, utilize programmable counter 30 to determine if pad 20 is between a CMOS logic level high and low due to a normal transition or due to contention. In case of contention, flip flop 32 negates GATE, which negates OBE and IBE and thus disables buffers 16 and 18. Operation of protection circuit 22 will be described in further detail with respect to the timing diagram of FIG. 2.

Figure 2:
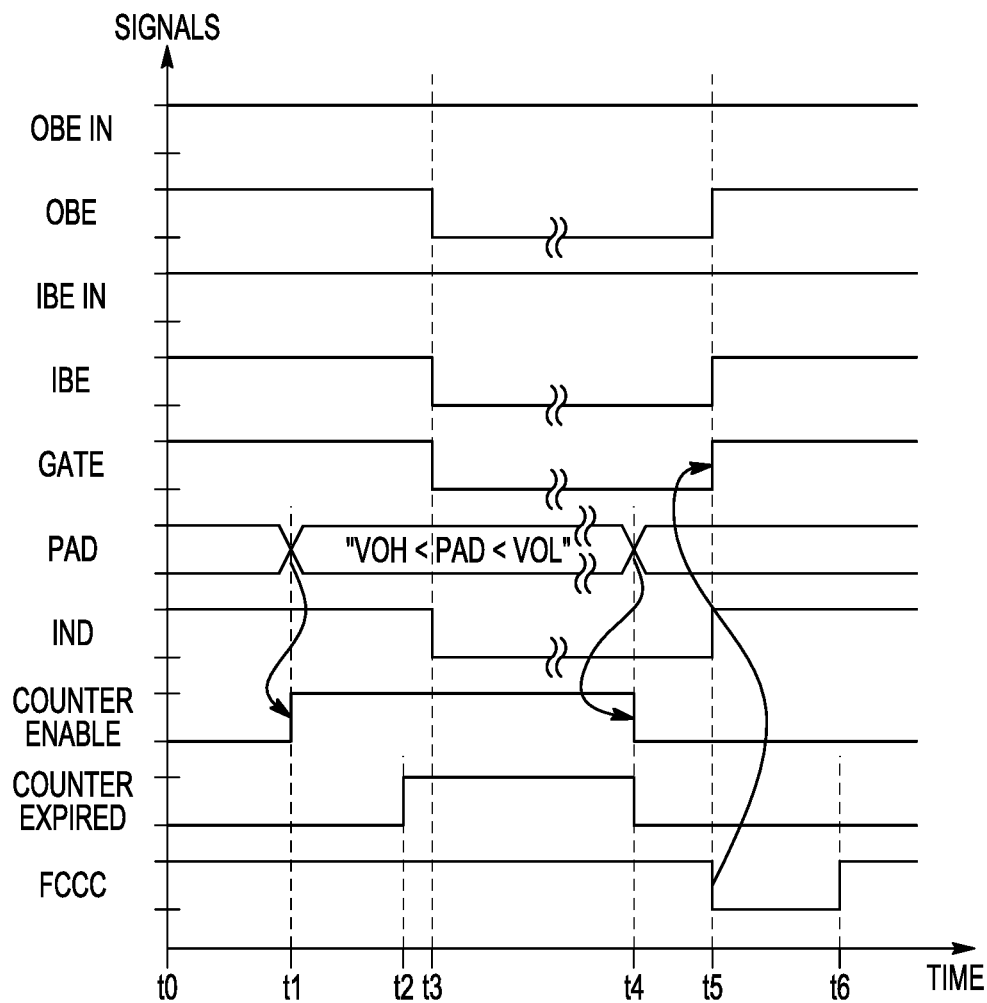
FIG. 2 illustrates a timing diagram of various signals of FIG. 1, in accordance with one embodiment of the present invention.

Initially, at time t0 of FIG. 2, OBE IN and IBE IN are logic level ones, as is GATE. Therefore, OBE and IBE are also logic level ones (which enables buffers 14 and 16). It is assumed that the voltage at pad 20 is greater than VOH, and therefore, pad 20 is at a logic level one as well. At time t1, it is assumed that a contention situation occurs on pad 20, in which, for example, buffer 16 is driving a logic level one onto pad 20 (in the case that DATA OUT at the input of buffer 16 is a logic level one), but another source external to IC 10 is driving a logic level zero onto pad 20. Therefore, at time t1, the voltage on pad 20 drops below VOH, but still remains above VOL. In this case, the outputs of comparators 24 and 26 go high and the output of AND 28 also transitions to a logic level one. This enables counter 30 to start counting down a predetermined count value, i.e. a predetermined number of clock cycles of CLK. The predetermined number of clock cycles represents a period of time that is greater than the maximum time a normal transition between a CMOS high and a CMOS low would take, meaning that any period of continuous time spent between VOH and VOL for a time greater than the period of time set by counter 30 (corresponding to time t2–t1) indicates a problem situation and not a normal transition. For example, in one embodiment, the maximum time a normal transition takes is 10 ns, therefore, counter 30 can be set to expire after at least 100 ns.

At time t1 the counter enables counter 30 and at time t2, counter 30 expires. Since the voltage on pad 20 was between VOH and VOL for a continuous time sufficient for counter 30 to expire, contention on pad 20 is indicated and when counter 30 expires, the counter expired output is asserted to a logic level one. This causes the value of zero at input D to be output at output Q as GATE. Therefore, as illustrated in FIG. 2, at time t3 GATE is set to a logic level zero, resulting in disabling buffers 16 and 18. As long as flip flop 32 is not reset, GATE remains at a logic level zero, preventing damage to GPIO 11. GATE can also be provided to control circuitry, such as FCCC, to indicate that contention has been detected. Therefore, note that GATE may also be referred to as a contention indicator. While GATE is a logic level zero, IBE and OBE are at logic level zeros, disabling buffers 16 and 18. Note that the control circuitry, such as FCCC, can accumulate fault indications from any place within IC 10.

Once contention is indicated, either a user of IC 10, or the system in which IC 10 resides, or software within IC 10 needs to address the issue. Once the contention is cleared or stopped, the FCCC can assert FCCC Clear to a logic level zero. Therefore, in FIG. 2, at time t4, the contention is cleared and pad 20 is again driven high. With the voltage on pad 20 going above VOH again, the output of comparator 24 goes low and thus the output of AND gate 28 also goes low. When the counter enable input goes low, counter 30 is reset to the full count value, and the output, counter expired, is again cleared to zero. After this point, such as at time t5, FCCC Clear can be safely asserted to a logic level zero to reset flip flop 32. Upon resetting flip flop 32, the Q output, and thus GATE, is again set to a logic level one, enabling each of AND gates 12 and 14 to provide the values of OBE IN and IBE IN as OBE and IBE, respectively. Therefore, buffers 16 and 18 are enabled to operate normally. At time t6, FCCC Clear can be returned to a logic level one in preparation for a next flip flop reset. If contention occurs again, counter 30 will again expire during the time that buffers 24 and 26 indicate the voltage at pad 20 is between VOL and VOH, and GATE will be cleared to zero to protect GPIO circuit 11. If contention does not occur, and instead a normal transition occurs on pad 20, counter 30 will not expire before the outputs of comparators 24 and 26 cause counter 30 to reset (by asserting the counter enable). In this case, with the counter not expiring, GATE remains a logic level one, and buffers 16 and 18 remain controlled by OBE IN and IBE IN, respectively.

Note that in the illustrated embodiment, taking care of the contention or the contention otherwise ending does not reenable buffers 16 and 18. For example, even if contention ends such that the voltage at pad 20 goes either above VOH or drops below VOL, buffers 16 and 18 are not yet reenabled. Instead, the output of AND gate 28 will go to zero, resetting counter 30. However, the Q output of flip flop 32 will remain at a logic level zero until it is reset by applying a logic level zero at the SETN input. In this manner, buffers 16 and 18 are only re-enabled when it is certain that contention is no longer present or that the user or system (e.g. via the FCCC) is properly notified, after which a reset signal can be explicitly provided to SETN to reenable the buffers. Note that D flip flop 32 along with gates 12 and 14 can be referred to as gating circuitry which generates GATE and uses GATE to provide OBE and IBE to buffers 16 and 18. Different implementations of gate circuitry can be used that provide the same logic and functionality to control IBE and OBE.

Figure 3:
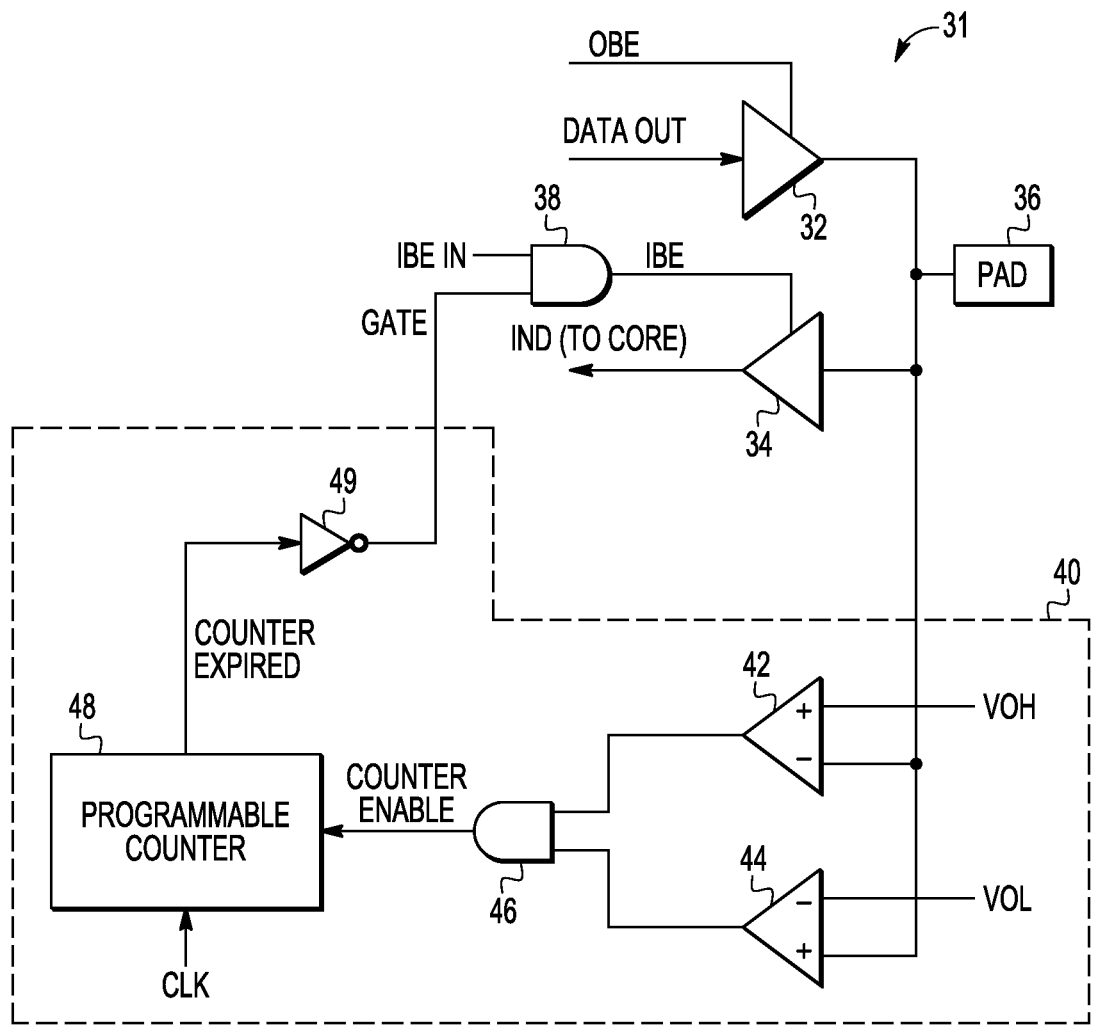
FIG. 3 illustrates, in partial block diagram form and partial schematic form, a GPIO circuit and a corresponding protection circuit, in accordance with one embodiment of the present invention.

FIG. 3 illustrates, in partial block diagram form and partial schematic form, an integrated circuit (IC) 30 having a GPIO circuit 31 and a corresponding protection circuit 40, in accordance with one embodiment of the present invention. GPIO circuit 31 includes an input/output (I/O) pad 36, output buffer 32, input buffer 34, and AND gate 38. An enable input of buffer 32 is coupled to receive an output buffer enable signal, OBE. Buffer 32 is coupled to receive DATA OUT as an input, and, when OBE is asserted, provides DATA OUT as an output to pad 36. When OBE is negated or deasserted, an output is not provided to pad 36. A first input of AND gate 38 is coupled to receive an input input buffer enable signal, IBE IN, a second input of AND gate 38 is coupled to receive GATE from protection circuit 40, and an output of AND gate 38 provides an input buffer enable signal, IBE, to an enable input of buffer 34. An input of buffer 34 is coupled to pad 36, and, when IBE is asserted, provides data from pad 36 as IND at its output. IND is provided to IC 30, such as to a processing core of IC 30. In one embodiment, pad 36 is a reset pad which receives reset signals, however, alternatively, pad 36 can be any type of input pad which can receive slow ramping signals.

Protection circuit 40, coupled to GPIO circuit 31, includes an inverter 49, a programmable counter 48, an AND gate 46, and comparators 42 and 44. A first input (non-inverting input) of comparator 42 is coupled to receive a first threshold voltage, VOH, and a second input (inverting input) of comparator 42 is coupled to pad 36. An output of comparator 42 is coupled to a first input of AND gate 46. A first input (inverting input) of comparator 44 is coupled to receive a second threshold voltage, VOL, and a second input (non-inverting input) is coupled to pad 36. An output of comparator 44 is coupled to a second input of AND gate 46. An output of AND gate 46 provides a counter enable signal to an enable input of programmable counter 48, which also receives a clock signal, clk. An output of programmable counter 48, which indicates if counter 48 has expired, is coupled to an input of inverter 49. An output of inverter 49 is coupled to provide GATE to the second input of AND gate 38. Note that counter 48 operates like counter 30 of FIG. 2.

In operation, IBE, provided to the enable input of buffer 34, is gated by the value of GATE. That is, when GATE is a logic level zero, IBE is a logic level zero, no matter the value of IBE IN. When GATE is a logic level one, though, the value of IBE IN is provided as IBE. The values of VOH and VOL correspond to CMOS high and low levels, in which the description provided above for VOH and VOL with respect to FIG. 1 also apply to the embodiment of FIG. 3. However, note that VOH and VOL in each of FIGS. 1 and 3 can be set differently from each other, depending on how lenient a logic level high or low is defined for each embodiment.

In the case in which pad 36 is a reset pad, the slew rate of a reset signal can be extremely slow. For example, in some embodiments, the reset signal is provided based on a slow event, such as the sun rising, and can therefore take minutes or even hours to ramp from a logic level low to a logic level high on pad 36. In this situation, an input buffer, such as buffer 34 coupled to pad 36, switches from a logic level low to a logic level high at its switch point (i.e. switch voltage), which corresponds to a voltage level somewhere between VOH and VOL. However, in the case of a slow ramp, any noise around the switch voltage can cause IND at the output of buffer 34 to switch back to a logic level low shortly after having switched to a logic level high. This causes IND to glitch and can cause IC 30 to enter an endless reset loop in which IC 30 is unable to fully exit reset due to the glitches. Therefore, protection circuit 40 disables buffer 34 during a period of time during which a ramping signal on pad 36 is passing through the switch point of buffer 34. In this manner, no glitches are caused due to noise about the switch point.

By using threshold values VOH and VOL, comparators 42 and 44 detect when a voltage on pad 36 is between a CMOS logic level high and low (between VOH and VOL). This may indicate that pad 36 is transitioning from a logic low to a logic high. However, this transition may correspond to a very slow ramp rate, in which a very slow ramp rate is a rate that is slower than a typical transition from a logic low to a logic high. Therefore, protection circuit 40, in response to comparators 42 and 44, utilize programmable counter 48 to determine if pad 36 is between a CMOS logic level high and low due to a normal transition or due to a problematic slow transition. In the case in which a slow ramp is detected, inverter 39 provides a logic level zero as GATE, which negates IBE and thus disables buffer 34. Note that, in this embodiment, OBE is not gated because it is not necessary or desirable to disable an output pad, such as pad 36, for a reset signal. Operation of protection circuit 40 will be described in further detail with respect to the timing diagram of FIG. 4.

Figure 4:
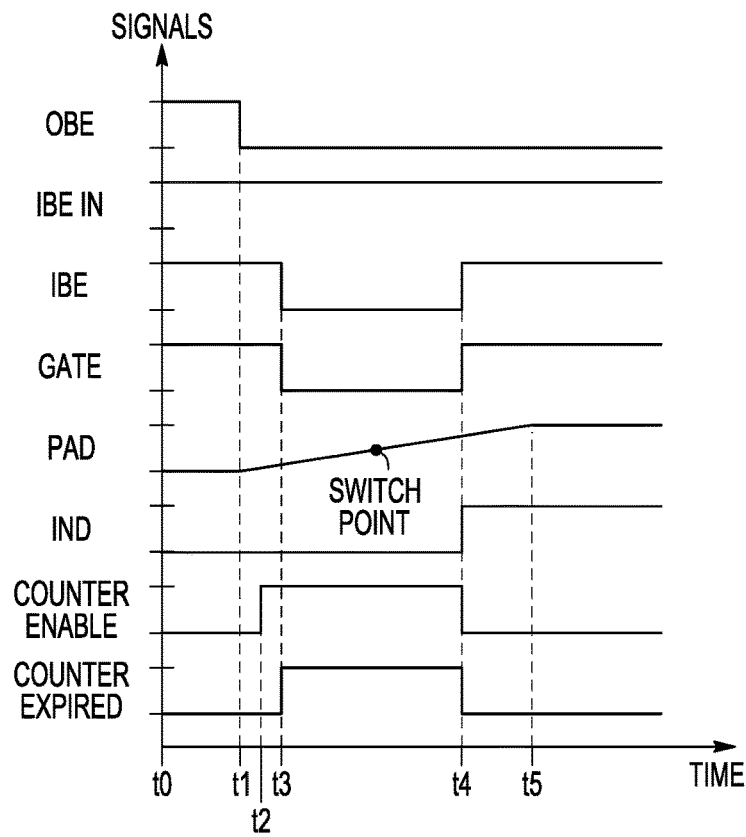
FIG. 4 illustrates a timing diagram of various signals of FIG. 3, in accordance with one embodiment of the present invention.

Initially, at time t0 of FIG. 4, OBE and IBE IN are at logic level ones, as is GATE. Therefore, IBE is also a logic level one. Counter expired output of counter 48 and counter enable are also at logic level zeros. In the case that pad 36 is a reset pad, pad 36 is initially driven low by setting OBE to a logic level one and DATA OUT (not illustrated in FIG. 4) to a logic level zero. Once the internal reset flow is complete for IC 30, buffer 32 is disabled by transitioning OBE to a logic level zero, which occurs at time t1 in the example of FIG. 4. At this point, pad 36 begins to go high based on the weak pull up resistors, usually located on the circuit board. Due to the weak pull up resistors, pad 36 experiences a slow ramp rate, which is much slower than a typical CMOS transition between a logic level low and logic level high.

In the illustrated example, the ramp on pad 36 occurs between time t1 and t5, which is longer than a typical transition. For the initial part of the ramp, beginning at t1, the voltage on pad 36 is less than VOL. Therefore, the output of comparator 44 remains at a zero, causing the output of AND gate 46 to remain a zero. (The output of comparator 46 at this time is a logic level one since the voltage on pad 36 is not greater than VOH.) However, at time t2, the voltage at pad 36 passes VOL, at which point, the output of comparator 44 becomes a logic level one, as is the output of comparator 42 (since pad 36 is still below VOH). This results in the output of AND gate 46, corresponding to counter enable, to go high. This enables counter 48 to start counting down a predetermined count value, i.e. a predetermined number of clock cycles of CLK. The predetermined number of clock cycles represents a period of time that is greater than the maximum time a normal transition between a CMOS high and a CMOS low would take, meaning that any period of continuous time spent between VOH and VOL for a time greater than the period of time set by counter 48 (corresponding to time t3–t2) indicates a slow ramp on pad 36. Also, in one embodiment, the maximum time a normal transition takes is 10 ns, therefore, counter 30 can be set to expire after at least 100 ns.

At time t3, counter 48 expires, indicating that the transition on pad 36 is long and pad 36 is still between VOL and VOH. At time t3, due to the counter expired output of counter 48 going high, GATE goes low and thus IBE goes low, disabling buffer 34. Buffer 34 remains disabled as the voltage on pad 36 rises up through the switch point of buffer 34 (which occurs somewhere between VOL and VOH). At time t4, the voltage at pad 36 passes VOH, causing the output of comparator 42 to go low. This causes the output of AND gate 46, or counter enable, to also go low, which resets counter 48. Upon resetting counter 48, the count value is again loaded, ready to count a next time the counter is enabled, and counter expired is cleared to zero. This results in GATE going to a logic level high, and buffer 34 being again enabled. At the point buffer 34 is reenabled, its input (the voltage at pad 36) is greater than its switch point. Therefore, the output of buffer 34, IND, goes to a logic level high. In this case, buffer 34 was not enabled for a period of time surrounding its switch point, preventing any glitches in IND due to any noise at the switch point. If a normal transition (versus a slow ramping transition) is occurring on pad 36, the counter will not expire before the outputs of comparators 42 and 44 cause counter 48 to reset (by asserting the counter enable). In this case, with the counter not expiring, GATE remains a logic level one, and buffer 34 remains controlled by IBE IN.

Note that in this embodiment, buffer 34 is automatically reenabled by protection circuit 40 when the voltage on the pad is again in a range that is either above VOH or below VOL. As seen in FIG. 3, once the voltage on pad 36 is no longer between VOL and VOH, the output of AND gate 46, and thus counter enable, goes low, which resets counter 48 and GATE stops forcing IBE to zero. This differs from the embodiment of FIGS. 1 and 2 in which protection circuit 22 detects a contention situation on GPIO pad 20 and disables buffers 14 and 16 until an explicit signal (e.g. FCCC Clear) is sent to protection circuit 22 to reenable the buffers. That is, even if the voltage on pad 20 becomes higher than VOH or lower than VOL, buffers 14 and 16 cannot be reenabled without the resetting of flip flop 32. In an alternate embodiment, in the case of pad 36 being a reset pad, the single ended receiver can have hysteresis, helping the pad's immunity against noise. However, as the perturbation on the pad voltage increases (as noise intensity increases), the hysteresis alone may be ineffective. Thus by disabling buffer 34 about the switch point, pad 36 is more fully immune to noise, regardless of its intensity.

Note that inverter 49 along with gate 38 can be referred to as gating circuitry which generates GATE and uses GATE to provide IBE to buffer 34. Different implementations of gate circuitry can be used that provide the same logic and functionality to control IBE. Note also that both protection circuits 22 and 40, along with the gating logic gates (such as the AND gates which receive GATE), can be referred to as reliability detectors, since both determine conditions in which the pad circuitry may not operating properly or may cause problems. Also, the single ended receivers illustrated herein can be implemented as differential receivers, which would suffer similar issues as the single ended receivers.

Figure 5:
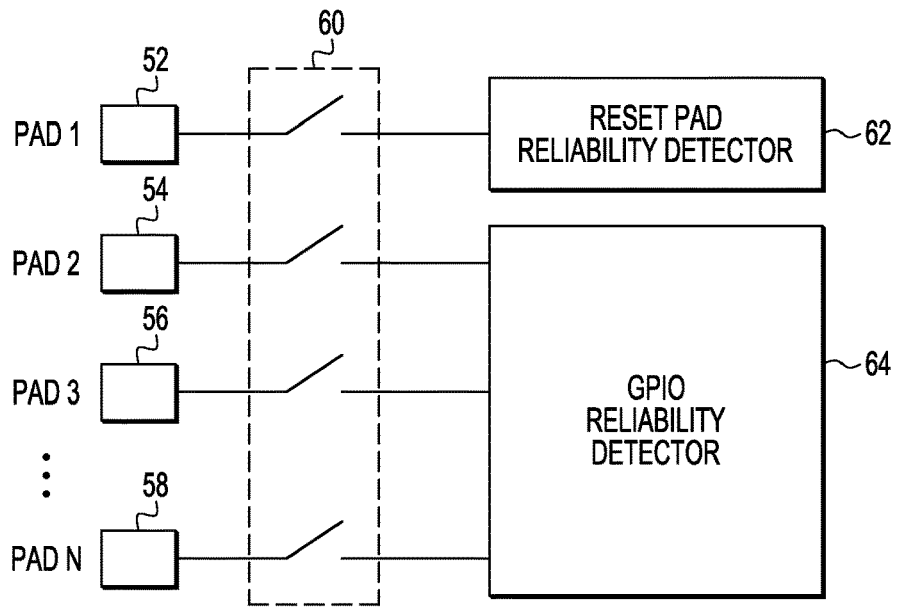
FIG. 5 illustrates in block diagram form, an integrated circuit including the protection circuits of FIGS. 1 and 3, in accordance to one embodiment of the present invention.

FIG. 5 illustrates an integrated circuit 50 having multiple I/O pad circuits, a reset pad reliability detector, and a GPIO reliability detector, in accordance with one embodiment of the present invention. IC 50 includes N signal pads, and each pad circuit corresponds to one signal pad of the N signal pads. Therefore, each pad circuit of IC 50, such as pad circuits 52, 54, 56, and 58, includes a signal pad (such as pad 20 or 36) and its corresponding buffer circuitry (such as buffers 14 and 16 or buffers 32 and 34) and gating AND gates (such as AND gates 12 and 14 or AND gate 38) coupled as described above in reference to FIG. 1 or 3. Pad circuit 52 includes signal pad 1, which corresponds to a reset pad. Pads 2-N may correspond to GPIO pads, in which pad 2 is located in pad circuit 54, pad 3 in pad circuit 56, and pad N in pad circuit 58. Pads 1-N are each coupled to a corresponding reliability detector via switches 60. For example, pad circuit 52 which includes pad 1, is coupled, via a switch of switches 60, to reset pad reliability detector 62. Reset pad reliability detector 62 includes circuitry like that of protection circuit 40, including the comparators, AND gate, programmable counter, and inverter. Referring to FIG. 3, the switch of switches 60 would be coupled between pad 36 and the inputs to comparators 42 and 44.

The pad circuits corresponding to pads 2-N are each coupled via a corresponding switch of switches 60 to GPIO reliability detector 64. GPIO reliability detector 64 includes circuitry like that of protection circuit 22. Referring to FIG. 1, the corresponding switch of switches 60 would be coupled between pad 20 and comparators 24 and 26. Therefore, in the embodiment of FIG. 5, each of the pad circuits has a corresponding switch coupled between the signal pad of the pad circuit and the protection circuit, in which the same protection circuit can be shared, and used sequentially, in turn, for each of pads 2-N. For example, each switch of switches 60 coupled to pads 2-N would be closed, in turn, to sequentially select a pad so that the protection circuit can operate to detect contention and, if necessary, disable the buffers for the selected pad. Switches, although not shown, may also be present between the Q output of the flip flop (such as flip flop 32 and the second inputs of the gating AND gates (such as AND gates 12 and 14). These switches would be controlled the same way as switches 60. Therefore, the protection circuit including the comparators, AND gate, programmable counter, and flip flop could be shared by the pads 2-N. In this manner, protection can be provided for both the reset pad and the GPIO pads of an IC, while not requiring repetition of the full protection circuit for each GPIO pad.

Therefore, by now it should be understood how a reliability detector may be used for a GPIO pad to detect and protect against problematic and damaging situations, such as contention, in which contention can be caused by driving different values on to the GPIO pad or by floating signals. Also, a reliability detector may be used for a reset pad or other input pad to detect slow ramping reset signals and prevent problematic glitches. Both types of reliability detectors use comparators and a programmable counter to determine when a voltage at the pad lingers too long (longer than required for a typical transition, such as greater than 10 ns) at a voltage between CMOS thresholds, VOH and VOL. In this manner, the programmable counter can provide an indication of this situation and gating circuitry can be used to disable the input or output buffers, or both, of a pad. For example, in the case of a reset pad, the programmable counter can provide an indication of a slow ramp so as to temporarily disable the input buffer around the noisy switch point of the input buffer. In the case of a GPIO pad, the programmable counter can provide an indication of damaging contention at the pad, and disable the input and output buffers until the contention is cleared. In this case, the input and output buffers can be safely re-enabled by an explicit signal, such as from control circuitry within the IC.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one. Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Some of the above embodiments, as applicable, may be implemented using a variety of different information processing systems. Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, different gating logic other than AND gates can be used to gate the OBE IN or IBE IN signals with the GATE signal to provide OBE and IBE. Also, any type of comparators can be used to determine if the pad voltage is between VOL and VOH. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, in an integrated circuit (IC) having a signal pad configured to communicate external to the IC, an output buffer coupled to provide signals to the signal pad and an input buffer coupled to receive signals from the signal pad, a method includes determining that a voltage on the signal pad is both greater than a predetermined low threshold voltage and lower than a predetermined high threshold voltage for a continuous amount of time greater than a predetermined period of time, wherein the predetermined low threshold voltage corresponds to a threshold below which a voltage corresponds to a logic level zero and the predetermined high threshold voltage corresponds to a threshold above which a voltage corresponds to a logic level one; and in response to determining that the voltage on the signal pad is both greater than the predetermined low threshold voltage and lower than the predetermined high threshold voltage for the continuous amount of time greater than the predetermined period of time, disabling the input buffer such that no signal from the signal pad is transmitted through the input buffer. In one aspect of this embodiment, in response to determining that the voltage on the signal pad is both greater than the predetermined low threshold voltage and lower than the predetermined high threshold voltage for the continuous amount of time greater than the predetermined period of time, disabling both the input and output buffers. In a further aspect, in response to determining that the voltage on the signal pad is both greater than the predetermined low threshold voltage and lower than the predetermined high threshold voltage for the continuous amount of time greater than the predetermined period of time, latching a value which disables both the input and output buffers. In yet a further aspect, the value which disables both the input and output buffers remains latched and continues to disable both the input and output buffers even if the voltage on the signal pad goes higher than the predetermined high threshold voltage or lower than the predetermined low threshold voltage. In yet a further aspect, the method further includes providing a reset signal to reset the latch such that the latch no longer disables the input and output buffers. In a further aspect, the latch is further characterized as a D flip lop. In another aspect of this embodiment, the method further includes after disabling the input buffer, when the voltage on the signal pad either goes higher than the predetermined high threshold voltage or goes lower than the predetermined low threshold voltage, reenabling the input buffer. In a further aspect, a switch point of the input buffer is at a voltage between the high predetermined threshold voltage and low predetermined threshold voltage, and wherein the input buffer is disabled at least while the voltage on the signal pad is crossing the switch voltage.

In another embodiment, an integrated circuit includes a signal pad; an output buffer having an output coupled to the signal pad and having an enable input; an input buffer having an input coupled to the signal pad and having an enable input; a counter which is enabled to start counting down a predetermined count value when a voltage on the signal pad is both higher than a predetermined low threshold voltage and lower than a predetermined high threshold voltage, wherein the predetermined low threshold voltage corresponds to a threshold below which a voltage corresponds to a logic level zero and the predetermined high threshold voltage corresponds to a threshold above which a voltage corresponds to a logic level one; and a gating circuit, coupled to the counter and the enable inputs of the input and output buffers, configured to, in response to the counter expiring, disable the input buffer and the output buffer. In a further aspect, the integrated circuit further includes a first comparator having a first input coupled to receive the predetermined high threshold voltage and a second input coupled to the signal pad; and a second comparator having a first input coupled to receive the predetermined low threshold voltage and a second input coupled to the signal pad, wherein when both the first comparator indicates that the voltage on the signal pad is lower than the predetermined high threshold voltage and the second comparator indicators that the voltage on the signal pad is higher than the predetermined low threshold voltage, the counter is enabled. In a further aspect, the gating circuit further includes a latch having a clock input and an output, wherein the latch is configured to latch a gating value when the counter expires, wherein the gating value forces the input buffer and the output buffer to be disabled. In yet a further aspect, the latch comprises a D flip flop having a clock input coupled to a counter expired indicator from the counter, a data input coupled to receive the gating value, and an output coupled to provide a gating indicator to control the enable inputs of the input buffer and the output buffer. In another aspect, the latch includes a reset input, wherein the latch is configured to, when the reset input is asserted, reset the gating value such that it no longer forces the input buffer and the output buffer to be disabled. In another aspect of the another embodiment, the integrated circuit further includes a first comparator having a non-inverting input coupled to receive the predetermined high threshold voltage and an inverting input coupled to the signal pad; and a second comparator having an inverting input coupled to receive the predetermined low threshold voltage and a non-inverting input coupled to the signal pad. In a further aspect, the integrated circuit further includes an AND gate having a first input coupled to an output of the first comparator, a second input coupled to an output of the second comparator, and an output coupled to provide a counter enable signal to an enable input of the counter. In yet a further aspect, the gating circuit further includes a D flip flop having a data input coupled to ground, a data output coupled to provide a gating output to control disabling of the input and output buffers, a clock input coupled to receive a counter expired signal from the counter, and a reset input coupled to receive a reset signal; a first AND gate having a first input coupled to receive an input output buffer enable (OBE) signal, a second input coupled to receive the gating output, and an output coupled to an enable input of the output buffer; and a second AND gate having a first input coupled to receive an input input buffer enable (IBE) signal, a second input coupled to receive the gating output, and an output coupled to an enable input of the input buffer. In another aspect of the another embodiment, the signal pad, output buffer, and input buffer are included in a first pad circuit, and the integrated circuit further includes a first switch coupled between the signal pad of the first pad circuit and the counter; second pad circuit having a second signal pad, a second output buffer coupled to the second signal pad, and a second input buffer coupled to the second signal pad, wherein the gating circuit is also coupled to the second output buffer and second input buffer; a second switch coupled between the second signal pad of the second pad circuit and the counter, wherein, when the first switch is closed and the second switch is open: the counter is enabled to start counting down the predetermined count value when the voltage on the signal pad is both higher than the predetermined low threshold voltage and lower than the predetermined high threshold voltage, and the gating circuit is configured to, in response to the counter expiring, disable the input buffer and the output buffer; and when the first switch is open and the second switch is closed: the counter is enabled to start counting down the predetermined count value when a voltage on the second signal pad is both higher than the predetermined low threshold voltage and lower than the predetermined high threshold voltage, and the gating circuit is configured to, in response to the counter expiring, disable the second input buffer and the second output buffer.

In yet another embodiment, an integrated circuit includes a reset signal pad coupled to receive a reset signal from an external source; an output buffer having an output coupled to the reset signal pad; an input buffer having an enable input coupled to receive an enable signal and a data input coupled to the reset signal pad; a counter having: a counter enable input wherein the counter is enabled to start counting down a predetermined count value when a voltage on the signal pad is both higher than a predetermined low threshold voltage and lower than a predetermined high threshold voltage, wherein the predetermined low threshold voltage corresponds to a threshold below which a voltage corresponds to a logic level zero and the predetermined high threshold voltage corresponds to a threshold above which a voltage corresponds to a logic level one, and a counter expired output configured to provide a gating value, wherein when the counter expires, the gating value forces the enable input to disable the input buffer until the counter is reset and while the counter is not expired, the gating value allows the input buffer to be selectively enabled and disabled. In a further aspect of the yet another embodiment, the integrated circuit further includes a first comparator having a first input coupled to receive the predetermined high threshold voltage and a second input coupled to the signal pad; and a second comparator having a first input coupled to receive the predetermined low threshold voltage and a second input coupled to the signal pad, wherein when both the first comparator indicates that the voltage on the signal pad is lower than the predetermined high threshold voltage and the second comparator indicators that the voltage on the signal pad is higher than the predetermined low threshold voltage, the counter is enabled. In yet another embodiment, a switch voltage of the input buffer is at a voltage between the high predetermined threshold voltage and low predetermined threshold voltage, wherein when the counter expires, the gating value forces the enable input to disable the buffer while the voltage on the signal pad is crossing the switch voltage.

What is claimed is:

1. In an integrated circuit (IC) having a signal pad configured to communicate external to the IC, an output buffer coupled to provide signals to the signal pad and an input buffer coupled to receive signals from the signal pad, a method comprising:

determining that a voltage on the signal pad is both greater than a predetermined low threshold voltage and lower than a predetermined high threshold voltage for a continuous amount of time greater than a predetermined period of time, wherein the predetermined low threshold voltage corresponds to a threshold below which a voltage corresponds to a logic level zero and the predetermined high threshold voltage corresponds to a threshold above which a voltage corresponds to a logic level one; and in response to determining that the voltage on the signal pad is both greater than the predetermined low threshold voltage and lower than the predetermined high threshold voltage for the continuous amount of time greater than the predetermined period of time, disabling the input buffer such that no signal from the signal pad is transmitted through the input buffer and disabling the output buffer.

2. The method of claim 1, wherein, in response to determining that the voltage on the signal pad is both greater than the predetermined low threshold voltage and lower than the predetermined high threshold voltage for the continuous amount of time greater than the predetermined period of time, latching a value which disables both the input and output buffers.

3. The method of claim 2, wherein the value which disables both the input and output buffers remains latched and continues to disable both the input and output buffers even if the voltage on the signal pad goes higher than the predetermined high threshold voltage or lower than the predetermined low threshold voltage.

4. The method of claim 3, further comprising:
providing a reset signal to reset the latch such that the latch no longer disables the input and output buffers.

5. The method of claim 4, wherein the latch is further characterized as a D flip lop.

6. In an integrated circuit (IC) having a signal pad configured to communicate external to the IC, an output buffer coupled to provide signals to the signal pad and an input buffer coupled to receive signals from the signal pad, a method comprising:

determining that a voltage on the signal pad is both greater than a predetermined low threshold voltage and lower than a predetermined high threshold voltage for a continuous amount of time greater than a predetermined period of time, wherein the predetermined low threshold voltage corresponds to a threshold below which a voltage corresponds to a logic level zero and the predetermined high threshold voltage corresponds to a threshold above which a voltage corresponds to a logic level one;

in response to determining that the voltage on the signal pad is both greater than the predetermined low threshold voltage and lower than the predetermined high threshold voltage for the continuous amount of time greater than the predetermined period of time, disabling the input buffer such that no signal from the signal pad is transmitted through the input buffer; and after disabling the input buffer, when the voltage on the signal pad either goes higher than the predetermined high threshold voltage or goes lower than the predetermined low threshold voltage, reenabling the input buffer.

7. The method of claim 6, wherein a switch point of the input buffer is at a voltage between the high predetermined threshold voltage and low predetermined threshold voltage, and wherein the input buffer is disabled at least while the voltage on the signal pad is crossing the switch voltage.

8. A integrated circuit comprising:
a signal pad;
an output buffer having an output coupled to the signal pad and having an enable input;
an input buffer having an input coupled to the signal pad and having an enable input;
a counter which is enabled to start counting down a predetermined count value when a voltage on the signal pad is both higher than a predetermined low threshold voltage and lower than a predetermined high threshold voltage, wherein the predetermined low threshold voltage corresponds to a threshold below which a voltage corresponds to a logic level zero and the predetermined high threshold voltage corresponds to a threshold above which a voltage corresponds to a logic level one; and
a gating circuit, coupled to the counter and the enable inputs of the input and output buffers, configured to, in response to the counter expiring, disable the input buffer and the output buffer.

9. The integrated circuit of claim 8, further comprising:
a first comparator having a first input coupled to receive the predetermined high threshold voltage and a second input coupled to the signal pad; and
a second comparator having a first input coupled to receive the predetermined low threshold voltage and a second input coupled to the signal pad, wherein when both the first comparator indicates that the voltage on the signal pad is lower than the predetermined high threshold voltage and the second comparator indicators that the voltage on the signal pad is higher than the predetermined low threshold voltage, the counter is enabled.

10. The integrated circuit of claim 9, wherein the gating circuit further comprises:
a latch having a clock input and an output, wherein the latch is configured to latch a gating value when the counter expires, wherein the gating value forces the input buffer and the output buffer to be disabled.

11. The integrated circuit of claim 10, wherein the latch comprises a D flip flop having a clock input coupled to a counter expired indicator from the counter, a data input coupled to receive the gating value, and an output coupled to provide a gating indicator to control the enable inputs of the input buffer and the output buffer.

12. The integrated circuit of claim 10, wherein the latch includes a reset input, wherein the latch is configured to, when the reset input is asserted, reset the gating value such that it no longer forces the input buffer and the output buffer to be disabled.

13. The integrated circuit of claim 8, further comprising:
a first comparator having a non-inverting input coupled to receive the predetermined high threshold voltage and an inverting input coupled to the signal pad; and
a second comparator having an inverting input coupled to receive the predetermined low threshold voltage and a non-inverting input coupled to the signal pad.

14. The integrated circuit of claim 13, further comprising:
an AND gate having a first input coupled to an output of the first comparator, a second input coupled to an output of the second comparator, and an output coupled to provide a counter enable signal to an enable input of the counter.

15. The integrated circuit of claim 14, wherein the gating circuit further comprising:
   a D flip flop having a data input coupled to ground, a data output coupled to provide a gating output to control disabling of the input and output buffers, a clock input coupled to receive a counter expired signal from the counter, and a reset input coupled to receive a reset signal;
   a first AND gate having a first input coupled to receive an input output buffer enable (OBE) signal, a second input coupled to receive the gating output, and an output coupled to an enable input of the output buffer; and
   a second AND gate having a first input coupled to receive an input input buffer enable (IBE) signal, a second input coupled to receive the gating output, and an output coupled to an enable input of the input buffer.

16. The integrated circuit of claim 8, wherein the signal pad, output buffer, and input buffer are included in a first pad circuit, the integrated circuit further comprising:
   a first switch coupled between the signal pad of the first pad circuit and the counter;
   second pad circuit having a second signal pad, a second output buffer coupled to the second signal pad, and a second input buffer coupled to the second signal pad, wherein the gating circuit is also coupled to the second output buffer and second input buffer;
   a second switch coupled between the second signal pad of the second pad circuit and the counter, wherein:
      when the first switch is closed and the second switch is open:
         the counter is enabled to start counting down the predetermined count value when the voltage on the signal pad is both higher than the predetermined low threshold voltage and lower than the predetermined high threshold voltage, and the gating circuit is configured to, in response to the counter expiring, disable the input buffer and the output buffer; and
      when the first switch is open and the second switch is closed:
         the counter is enabled to start counting down the predetermined count value when a voltage on the second signal pad is both higher than the predetermined low threshold voltage and lower than the predetermined high threshold voltage, and the gating circuit is configured to, in response to the counter expiring, disable the second input buffer and the second output buffer.

17. A integrated circuit comprising:
   a reset signal pad coupled to receive a reset signal from an external source;
   an output buffer having an output coupled to the reset signal pad;
   an input buffer having an enable input coupled to receive an enable signal and a data input coupled to the reset signal pad;
   a counter having:
      a counter enable input wherein the counter is enabled to start counting down a predetermined count value when a voltage on the signal pad is both higher than a predetermined low threshold voltage and lower than a predetermined high threshold voltage, wherein the predetermined low threshold voltage corresponds to a threshold below which a voltage corresponds to a logic level zero and the predetermined high threshold voltage corresponds to a threshold above which a voltage corresponds to a logic level one, and
      a counter expired output configured to provide a gating value, wherein when the counter expires, the gating value forces the enable input to disable the input buffer until the counter is reset and while the counter is not expired, the gating value allows the input buffer to be selectively enabled and disabled.

18. The integrated circuit of claim 17, further comprising:
   a first comparator having a first input coupled to receive the predetermined high threshold voltage and a second input coupled to the signal pad; and
   a second comparator having a first input coupled to receive the predetermined low threshold voltage and a second input coupled to the signal pad, wherein when both the first comparator indicates that the voltage on the signal pad is lower than the predetermined high threshold voltage and the second comparator indicators that the voltage on the signal pad is higher than the predetermined low threshold voltage, the counter is enabled.

19. The integrated circuit of claim 18, wherein a switch voltage of the input buffer is at a voltage between the high predetermined threshold voltage and low predetermined threshold voltage, wherein when the counter expires, the gating value forces the enable input to disable the buffer while the voltage on the signal pad is crossing the switch voltage.

* * * * *